US011152522B2

(12) United States Patent
Andersson

(10) Patent No.: US 11,152,522 B2
(45) Date of Patent: Oct. 19, 2021

(54) SEMICONDUCTOR RADIATION DETECTOR

(71) Applicant: OXFORD INSTRUMENTS TECHNOLGIES OY, Espoo (FI)

(72) Inventor: Hans Andersson, Vantaa (FI)

(73) Assignee: OXFORD INSTRUMENTS TECHNOLOGIES OY, Espoo (FI)

( * ) Notice: Subject to any disclaimer, the term of this patent is extended or adjusted under 35 U.S.C. 154(b) by 191 days.

(21) Appl. No.: 16/476,736

(22) PCT Filed: Jan. 8, 2018

(86) PCT No.: PCT/EP2018/050334
§ 371 (c)(1),
(2) Date: Jul. 9, 2019

(87) PCT Pub. No.: WO2018/130487
PCT Pub. Date: Jul. 19, 2018

(65) Prior Publication Data
US 2019/0363204 A1    Nov. 28, 2019

(30) Foreign Application Priority Data

Jan. 10, 2017 (EP) ..................... 17150780

(51) Int. Cl.
*H01L 31/18* (2006.01)
*H01L 31/119* (2006.01)
(Continued)

(52) U.S. Cl.
CPC .... *H01L 31/03926* (2013.01); *H01L 31/0203* (2013.01); *H01L 31/024* (2013.01);
(Continued)

(58) Field of Classification Search
CPC ........... H01L 31/03926; H01L 31/0392; H01L 31/024; H01L 31/0203; H01L 31/02002–02013
See application file for complete search history.

(56) References Cited

U.S. PATENT DOCUMENTS 5,940,562 A * 8/1999 Henson ................ G02B 6/3885
                                                           385/88
7,812,316 B2   10/2010 Hansen et al.
(Continued)

FOREIGN PATENT DOCUMENTS

EP        2881995 A       6/2015
WO    2007/017272 A1    2/2007

OTHER PUBLICATIONS

International Search Report and Written Opinion, dated Apr. 5, 2018, from corresponding PCT application No. PCT/EP2018/050334.
(Continued)

*Primary Examiner* — Kenneth Parker
*Assistant Examiner* — Long H Le
(74) *Attorney, Agent, or Firm* — Nixon & Vanderhye

(57) ABSTRACT

Disclosed is a semiconductor radiation detector assembly including a detector chip having a front side for receiving radiation and a back side; and a flexible substrate including a center portion having its front side attached to the back side of the detector chip and a plurality of strips extending from the center portion and bent to protrude away from the detector chip, wherein the flexible substrate includes a plurality of conductive tracks that extend on a surface of the strips from the center portion towards lateral ends of the strips for electrical coupling and mechanical attachment to (Continued)

one of a plurality of contact pins, and wherein the detector chip is electrically coupled to at least one of the conductive tracks.

9 Claims, 6 Drawing Sheets

(51) Int. Cl.
    *H01L 31/0392* (2006.01)
    *H01L 31/02* (2006.01)
    *H01L 31/0203* (2014.01)
    *H01L 31/024* (2014.01)
    *G01N 23/223* (2006.01)

(52) U.S. Cl.
    CPC ...... *H01L 31/02005* (2013.01); *H01L 31/119* (2013.01); *H01L 31/18* (2013.01); *G01N 23/223* (2013.01); *G01N 2223/507* (2013.01)

(56) References Cited

U.S. PATENT DOCUMENTS

| 9,548,402 | B2 | 1/2017 | Kämäräinen |
| 2005/0152634 | A1* | 7/2005 | Okamoto ........ H01L 31/022408 385/14 |
| 2005/0274882 | A1* | 12/2005 | Minamio ............ H01S 5/02208 250/239 |
| 2009/0084971 | A1 | 4/2009 | Ohta et al. |
| 2013/0108019 | A1 | 5/2013 | Tkaczyk et al. |
| 2014/0021361 | A1* | 1/2014 | Yasui ...................... G01T 1/244 250/370.01 |
| 2014/0318832 | A1* | 10/2014 | Huang ................ H05K 3/4691 174/254 |

OTHER PUBLICATIONS

Office Action issued in European Patent Application No. 17 150 780.9 dated Dec. 5, 2019.

* cited by examiner

SEMICONDUCTOR RADIATION DETECTOR

TECHNICAL FIELD

The present invention relates to a structure and a manufacturing method for a semiconductor radiation detector. In particular, various embodiments of the present invention relate to semiconductor radiation detector that provides good detection performance and is durable and reliable in structure but that is yet straightforward to manufacture.

BACKGROUND

A semiconductor radiation detector is a device that may be applied to produce one or more electrical signals that are descriptive of radiation in its immediate vicinity. In a typical application, a semiconductor radiation detector is provided as part of a radiation detector assembly that is arranged in a radiation-detecting device in a manner that allows radiation to enter a front face (or front side) of the radiation detector as freely as possible in order to detect incoming radiation in a reliable a manner, whereas the back side of the radiation detector assembly is mechanically and electrically coupled to a radiation-detecting appliance in order to relay the one or more electrical signals for analysis of detected radiation.

An example of an appliance making use of a semiconductor radiation detector is a handheld or otherwise portable analyzer device that may be used in the field e.g. for recognizing and sorting objects according to material(s) they contain. As a few examples, a portable analyzer device may be used in places like scrapyards, dumping grounds and recycling centers. In such an analyzer device the radiation detector is typically arranged in a front-end of the analyzer device to enable a user of the analyzer device to bring the part of the analyzer device hosting the radiation detector to a close or even direct contact with the sample to be analyzed.

Non-limiting examples of semiconductor radiation detectors suitable for such applications include a PIN diode and a silicon drift detector (SDD). Effective operation of semiconductor radiation detectors benefits from providing the radiation detector and its immediate electric contacts as a detector head that is sealed into a gas-tight enclosure by a detector can. Typically, a front face of the detector can is provided with a radiation window through which the radiation is able to enter the radiation detector inside the enclosure but that at the same time prevents e.g. moisture, air, visible light and ultraviolet (UV) light from the operating environment of the device from reaching the radiation detector. The back side of the detector head provides attachment means and contact pins that enable coupling the detector head mechanically, electrically and thermally to the radiation-detecting appliance. Typically, a thermoelectric cooler such as a Peltier element is also included in the detector head.

FIG. 1 depicts a cross-section of a detector head connected to a so-called header that further connects the detector head to the radiation-detecting appliance in order to illustrate some structural elements of the detector head and the header, which together may be referred to as a radiation detector assembly. This illustration of FIG. 1 is, however, a simplified one for improved graphical clarity and omits possible intermediate shielding layers and other components or features that are not essential for understanding the background of the present invention.

In the example of FIG. 1, the detector head comprises a detector chip 101, a ceramic substrate 102 and a thermoelectric cooler 103: the detector chip 101 that is attached on one (first) side of the ceramic substrate 102, whereas the opposite (second) side of the ceramic substrate 102 is attached to the thermoelectric cooler 103. When assembled on the header, the detector head is supported by a metallic base plate 104 having a protruding attachment bolt 105 and covered by a detector can 106, the base plate 104 and the detector can 106 thereby providing the gas-tight enclosure around the detector head. The front face of the detector can 106 has an opening covered by a radiation window 107 to enable the incoming radiation to enter the detector chip 101.

FIG. 1 further depicts contact pins 108 that go through holes in the base plate 104, which contact pins 108 are electrically isolated from the base plate 104 by respective insulator sleeves 109. The base plate 104, the attachment bolt 105, the contact pins 108, and the insulator sleeves 109 may be considered as components of the header. A respective bonding wire 110 connects the top end of each contact pin 108 to a bonding pad 111 on the top surface of the ceramic substrate 102. Further bonding wires (not shown) may be applied to provide electric connections between areas of the substrate 102 and respective contact pads on the detector chip 101. The choice of using wire bonding as the technology for providing the electric connections involves an inherent advantage of low thermal conductivity, which is beneficial in avoiding transferring heat from the contact pins 108 to the ceramic substrate 102 and further to the detector chip 101.

The ceramic substrate 102 is typically made of aluminum oxide ($Al_2O_3$), aluminum nitride (AlN), beryllium oxide (BeO) or similar ceramic material. The ceramic substrate 102 is typically further covered by a patterned conductive layer to provide electrical connections between the detector chip 101 and the components coupled thereto via the electric connections implemented through the bonding wires described in the foregoing. In addition to the detector chip 101, some further components such as an amplifier, a pre-amplifier, an analog-to-digital converter (ADC), a thermal sensor, a humidity sensor and/or a pressure sensor may be arranged on the ceramic substrate 102.

As an example of an additional component that is typically included in the detector head but not depicted in FIG. 1, a spacer may be included between ceramic substrate 102 and the thermoelectric cooler 103. In other words, the ceramic substrate 102 may attach to the thermoelectric cooler 103 via the spacer. The spacer may be provided as a layer of suitable ceramic material (e.g. $Al_2O_3$, AlN, BeO) of desired thickness and it includes one or more openings or recesses that enable attaching further components (e.g. one or more of the amplifier, pre-amplifier, the ADC, the thermal sensor, the humidity sensor and the pressure sensor) on the second side of the ceramic substrate 102 at positions that are aligned with positions of the openings or recesses in the spacer and providing electric connections (e.g. by wire-bonding) between the components and the ceramic substrate 102. Although described in this example as a component separate from the ceramic substrate 102, in other examples the second side of the ceramic substrate 102 may be shaped to provide a portion that serves as the spacer along the lines described in the foregoing.

Techniques used for producing these types of ceramic substrates are commonly referred to as thick-film, thin-film, low temperature co-fired ceramic (LTCC) or high temperature co-fired ceramic (HTCC). The ceramic materials (such as $Al_2O_3$, AlN and BeO) used for the ceramic substrate 102 have good thermal performance in terms of having a relatively high thermal conductance (in other words, relatively low thermal resistance) and having a coefficient of thermal expansion (CTE) close to that of silicon that is commonly used as the material for the detector chip 101.

While a good and reliable radiation detection performance is naturally a key aspect for any detector head and/or radiation detector assembly making use of a detector head, other important aspects include affordability and simplicity of manufacturing the detector head and/or assembling it into a radiation detector assembly. In general, for good detection sensitivity and hence for good performance of the detector head it is beneficial to provide as large detector chip area as possible: the larger surface of the detector chip collects a larger amount of radiation, thereby increasing the detection performance via wider exposure to the incoming radiation. In this regard, for example in the detector head structure of FIG. 1 the ceramic substrate 102, and thus also the detector chip 101, must be smaller in area than the area defined by the contact pins 108, because the bonding wedge must be able to touch the top ends of the contact pins 108 as well as the bonding pads on the ceramic substrate 102 and on the detector chip 101 from above to enable creating the electrical connections between these elements of the detector head by the bonding wires.

While a straightforward solution for increased area of the detector chip 101 would be to increase the size of the detector head to allow a detector chip with increased surface area (e.g. increased diameter in case of a detector chip of circular shape), such an approach necessarily runs into practical limitations since increased size of the detector head would make it more difficult to place the radiation detector assembly in close enough proximity of a sample under analysis e.g. when employing the radiation detector assembly in a handheld analyzer device in field conditions. Moreover, in a practical construction the area defined by the contact pins 108 must always be substantially smaller than the area (e.g. the diameter) of the base plate: hermetically sealing and electrically insulating the contact pins 108 from the base plate 104 necessitate use of insulator sleeves 109 that completely encircle the respective contact pins 108 and therefore have a certain minimum wall thickness, while also a rim of certain thickness is required between the holes that go through the base plate 104 and the edge of the base plate 104.

A known solution for increasing the detector chip area in relation to the overall size of the detector head is illustrated in FIG. 2, wherein only elements that exhibit a difference to the example of FIG. 1 are identified with respective reference numbers. In the example of FIG. 2, a respective bonding wire 210 connects the side surface of each contact pin 208 to a respective bonding pad 211 arranged on the side surface of a ceramic substrate 202 to provide electric connection therebetween. Consequently, relocation of the bonding pads 211 from the front surface (cf. the bonding pads 111 in FIG. 1) to the side surface of the ceramic substrate 202 enables using a detector chip 201 of larger area. This approach enables the detector chip 201 to have an area that is only marginally smaller than the area defined by the contact pins 208. Also the detector head of FIG. 2 may be provided with a spacer described in the foregoing in context of FIG. 1.

Another known solution for increasing the detector chip area in relation to the overall size of the detector head is illustrated in FIG. 3, wherein only elements that exhibit a difference to the example of FIG. 1 or 2 are identified with respective reference numbers. In the example of FIG. 3, the ceramic substrate comprises a first ceramic substrate 302 to which a detector chip 301 is flip-chip bonded on one side, whereas a second ceramic substrate 312 attached on the opposite side of the first ceramic substrate 302. The outer edge of the second ceramic substrate 312 is provided with cavities in which bonding pads (not shown in FIG. 3) are located, and a respective bonding wire 310 connects the top of each contact pin 308 to one of the bonding pads. In this approach, in practice the area covered by the second ceramic substrate 312 is marginally smaller than the area defined by the contact pins 308 (to enable wire bonding from the top), whereas the detector chip 301 may have an area that is larger than or equal to the that of the second ceramic substrate 312 and also larger than or equal to the area defined by the contact pins 308. In the example of FIG. 3, the second substrate 312 may be provided with suitably positioned openings to make it additionally serve as a spacer described in the foregoing in context of FIG. 1.

While addressing the detection performance aspect via enabling increased size of the detector chip, the examples of both FIGS. 2 and 3 at the same time result in detector head structures of increased complexity of manufacturing. In this regard, a further known solution for increasing the detector chip area in relation to the overall size of the detector head is described in detail in EP 2881995 via a number of examples, while the structure described therein also enables convenient manufacturing process. According to an example provided therein, a structural feature that enables providing a detector chip of increased area includes usage of a joint plate that serves to mechanically connect a sub-assembly including components of the detector head to another sub-assembly including components of the header to each other and that provides the electric connections between the sub-assemblies that in their assembled form constitute the radiation detector assembly.

Nevertheless, there is a continuous need for a detector head with good radiation detection performance while having a structure that that facilitates affordable and straightforward manufacturing process.

SUMMARY

It is an object of the present invention to provide a detector head structure that allows providing a large detector chip area in relation to the overall size and/or area of the detector head while enabling easy manufacturing and high reliability in use.

In the following, a simplified summary of some embodiments of the present invention is provided in order to facilitate a basic understanding of a portable analyzer according to various embodiments of the present invention. The summary is, however, not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

According to an example embodiment, a semiconductor radiation detector assembly is provided, the semiconductor radiation detector assembly comprising a detector chip having a front side for receiving radiation and a back side; and a flexible substrate comprising a center portion having its front side attached to the back side of the detector chip and a plurality of strips extending from the center portion and bent to protrude away from the detector chip, wherein said flexible substrate comprises a plurality of conductive tracks that extend on a surface of said strips from said center portion towards lateral ends of said strips for electrical coupling and mechanical attachment to one of a plurality of contact pins, and wherein the detector chip is electrically coupled to at least one of said conductive tracks.

According to another example embodiment, a method for manufacturing a semiconductor radiation detector is provided, the method comprising arranging conductive tracks on desired positions of at least one surface of a piece of flexible substrate material; cutting the piece of flexible substrate material into a flexible substrate having a shape that includes a center portion for attachment of a detector chip on the first side and a plurality of strips that extend from the center portion and that have respective conductive tracks on at least one surface extending from the center portion towards lateral ends of the strips; bending said strips to protrude away from the first side of the flexible substrate; and attaching the detector chip to the first side of the center portion of the flexible substrate and creating electric connection between the detector chip and at least one of the conductive tracks.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF DRAWINGS

The embodiments of the invention are illustrated by way of example, and not by way of limitation, in the figures of the accompanying drawings where FIG. 1 schematically illustrates some components of a known radiation detector assembly.

DETAILED DESCRIPTION

Figure 4:
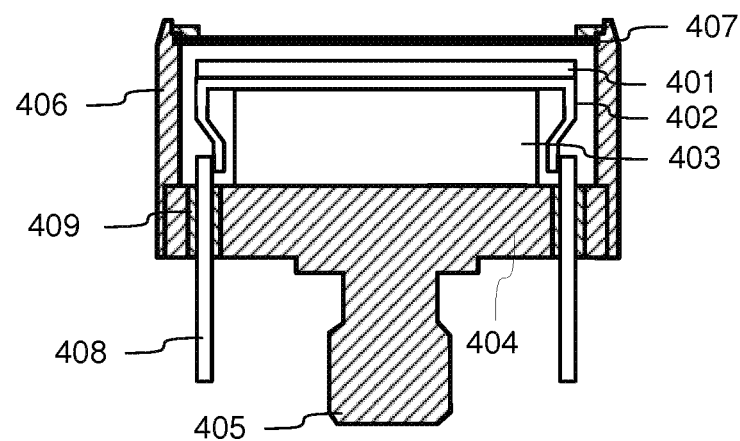
FIG. 4 schematically illustrates some components of a radiation detector assembly according to an example embodiment.

FIG. 4 schematically illustrates some elements of a detector head according to an example embodiment, arranged on a header to provide a radiation detector assembly. In this example, the detector head comprises a detector chip 401 that has a front side for receiving radiation to be detected and a back side for attachment to other components of the detector head. The front side of the detector chip 401 may be also referred to as a front surface, as a first side or as a first surface, whereas the back side may be also referred to as a back surface, as a back side or as a back surface. The detector chip 401 may be operatively similar to the detector chip 101, 201, 301 and hence a known detector chip of desired type may be employed, e.g. a SDD or a PIN diode.

In the illustration of FIG. 4, the back side of the detector chip is attached on a first side of a flexible substrate 402, which first side may also be referred to as a front side of the flexible substrate 402 in the assembled form of the detector head structure of FIG. 4. The detector chip 401 is also electrically coupled to the flexible substrate 402 to enable providing electrical signals that are descriptive of radiation detected by the detector chip 401 to the header and further to a radiation-detecting appliance to which the radiation detection assembly provided by the detector head and the header is installed.

Figure 2:
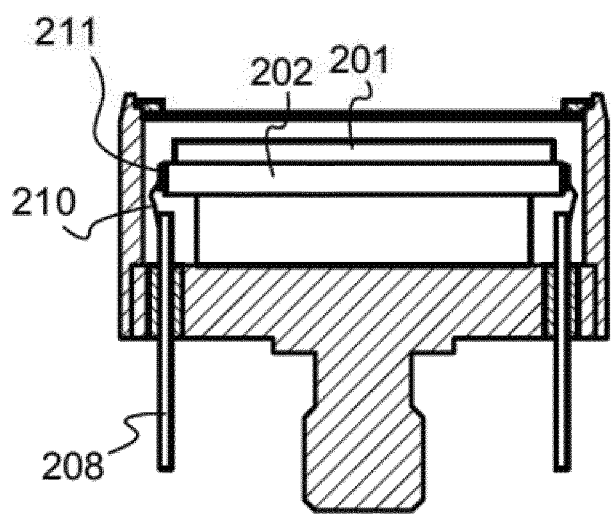
FIG. 2 schematically illustrates some components of another known radiation detector assembly.
Figure 3:
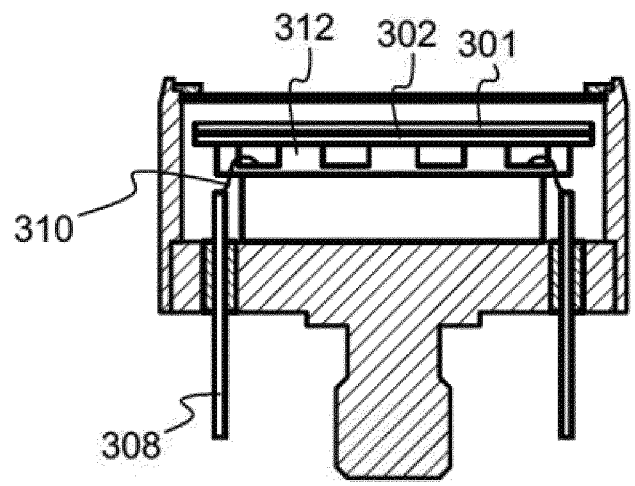
FIG. 3 schematically illustrates some components of a further known radiation detector assembly.

A second side of the flexible substrate 402, i.e. the side opposite to the first side, is attached to a thermoelectric cooler 403. The second side of the flexible substrate 402 may also be referred to as a back side of the flexible substrate 402 in the assembled form of the detector head structure. The thermoelectric cooler 403 may be operatively similar to the thermoelectric cooler 103, shown in context of the known radiation detector assemblies of FIGS. 1 to 3 and a thermoelectric cooler of desired type may be employed, e.g. a Peltier element.

Figure 1:
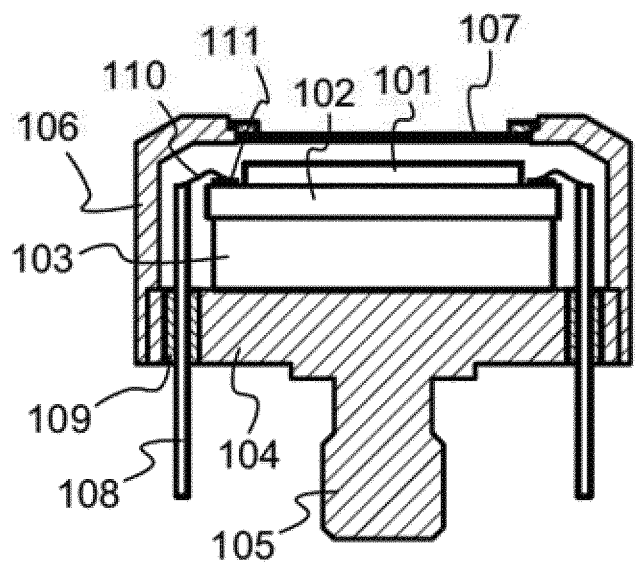

Along the lines described in context of FIG. 1, when assembled on the header, the detector head is supported by a base plate 404 covered by a detector can 406, the base plate 404 and the detector can 406 thereby providing the gas-tight enclosure around the detector head. The base plate 404 is typically made of metal and it has an attachment bolt 405 protruding away from the detector head. The front face of the detector can 406 has an opening covered by a radiation window 407 to enable the incoming radiation to enter the front side of detector chip 401, while it prevents e.g. air, moisture, visible light and UV light from entering the enclosure around the detector head. FIG. 4 further depicts contact pins 408 that go through holes in the base plate 404, which contact pins 408 are electrically isolated from the base plate 404 by respective insulator sleeves 409. The base plate 404, the attachment bolt 405, the contact pins 408, and the insulator sleeves 409 may be considered as components of the header.

The flexible substrate 402 is provided with conductive tracks on at least one of its surfaces to enable the electric connections between the detector chip 401 attached on the first side (front side) of the flexible substrate 402 and the header. The flexible substrate 402 is shaped to have a plurality of strips extending outwards from its center portion, each of the strips provided with a respective conductive track on its surface, where the strips are bent to protrude away from the detector chip 401 and hence away from the first side (front side) of the flexible substrate 402. The strips have the same or substantially the same length. The bent strips serve both to enable electric coupling between the detector head and the header and to enable or assist mechanical attachment between the detector head the header. In particular, the conductive tracks in the protruding strips are arranged into contact with respective ones of the contact pins 408 e.g. such that a conductive track at or close to the distal end of a strip is brought into contact with a side of a contact pin 408. The mechanical attachment and electrical coupling between the conductive tracks on the protruding strips and the contact pins 408 may be provided, for example, by soldering, by welding, by electrically conductive glue or by wire-bonding.

In an example, the conductive tracks on at least one surface of the flexible substrate 402 are provided on the second surface (back surface) of the flexible substrate 402. In such an arrangement, the center portion of the flexible substrate 402 has an opening that enables electric connections between the back side of the detector chip 401 and the conductive tracks on the back surface of the flexible substrate 402 to be provided e.g. by wire-bonding, while the electric connection to the header is enabled by arranging the second surface at or close to the distal ends of the strips into contact with respective ones of the contact pins 408, e.g. at side surfaces of the contact pins 408

In a variation of the above example, there are conductive tracks both on the first and second surfaces of the flexible substrate 402 such that in the center portion and at least in the proximal ends of the strips the conductive tracks are provided in the second surface (back surface) of the flexible substrate 402, whereas in the distal ends of the strips the conductive tracks are provided in the first surface (front surface) of the flexible substrate 402. In each strip, the electric connection between the (first) conductive track on the second surface in its proximal end and the (second) conductive track on the first surface in its distal end is provided via a conductive via through the respective strip. Also this approach enables electric connections (e.g. by wire-bonding) between the back side of the detector chip 401 and the conductive tracks on the back surface of the flexible substrate 402 through the opening in the center portion of the flexible substrate 402, while the electric connection to the header is provided by arranging the first surface at or close to the distal end of the strip into contact with respective one of the contact pins 408, e.g. at the side surface of the respective contact pin 408.

In another example, the electric connection between the detector chip 401 and the flexible substrate 402 may be provided between the first (front) sides thereof. In this regard, a dedicated conductive track may be provided on the first side (front side) of the center portion of the flexible substrate 402 to enable providing electric connection to the first (front) side of the detector chip 401. Also these electric connections may be provided e.g. by wire-bonding. To enable making this electric connection, the detector chip 401 may be provided with a cut or a recess that leaves the further conductive track exposed on the front side of the flexible substrate 402 or the detector chip 401 may otherwise have a shape and/or size that leaves the further conductive track exposed on the front side of the flexible substrate 402. In this example, the opening in the center portion of the flexible substrate 402 is not necessarily needed, but the electric connection between the dedicated conductive track on the first surface (front surface) of the flexible substrate 402 and the conductive tracks on the back surface of the flexible surface 402 may be provided by a conductive via through (the center portion of) the flexible substrate 402.

In a further example, the electric connection between the detector chip 401 and the flexible substrate 402 may be provided by using a further strip extending from the center portion of the flexible substrate 402: the further bendable strip has a conductive track on its first surface at least at or close to its distal end, which is brought into electrical contact to the conductive track on the second side of the flexible substrate 402 by a conductive via through the further strip. The further strip is bent such that the conductive track in its distal end is brought into contact with the desired position on the first surface (front surface) of the detector chip 401 to provide the electric connection. Such an arrangement does not require leaving a conductive strip on the first surface of the flexible substrate 402 exposed for making the electric connection to the first surface (front surface) of the detector chip 401 while the opening in the center portion of the flexible substrate 402 is not necessarily needed either.

Figure 5:
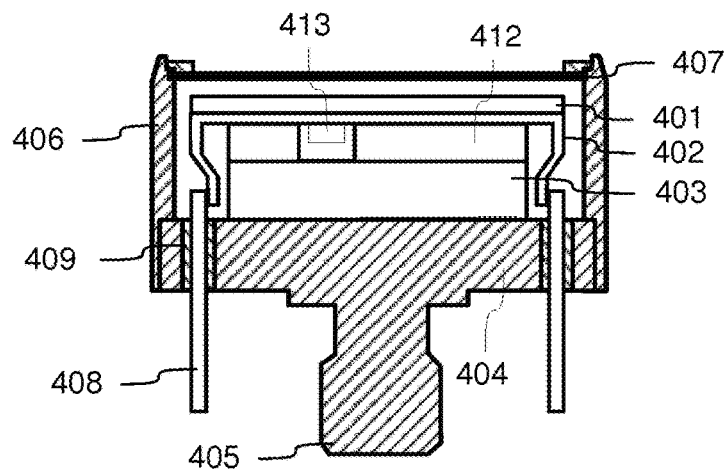
FIG. 5 schematically illustrates some components of a radiation detector assembly according to an example embodiment.

Provision of the conductive tracks on the second surface (back surface) of the flexible substrate 402 enables convenient attachment of one more detector head components on the back side of (the center portion of) the flexible substrate 402, as schematically illustrated in FIG. 5. This example is similar to that of FIG. 4 but it additionally includes a first spacer 412 between the flexible substrate 402 and the thermoelectric cooler 403 and a component 413 attached to the second side (back side) of the center portion of the flexible substrate 402. The first spacer 412 serves to avoid contact between the component 413 (and/or its electric connections) to the thermoelectric cooler 403.

The first spacer 412 may be made of suitable ceramic material (e.g. $Al_2O_3$, AlN, BeO) of desired thickness and it includes at least one opening or recess that enables attaching the component 413 (e.g. an amplifier, a pre-amplifier, an ADC, a thermal sensor, a humidity sensor, a pressure sensor) on the second side (back side) of the flexible substrate 402 at a position that spatially coincides with the position of the at least one opening or recess in the first spacer 412 and providing electric connections (e.g. by wire-bonding) between the component 413 and a conductive track on the second side (back side) of the flexible substrate 402. Although described herein using a single component 413 and a single opening or recess in the first spacer 412 as example, in general there may be one or more components attached to the second side (back side) of the flexible substrate 402 that spatially coincide with positions of one or more openings or recesses in the first spacer 412.

Using the flexible substrate 402 to replace the ceramic substrate 102, 202, 302, 312 employed in previously known solutions provides a number of advantages, some of which are outlined in the following:

A detector head structure that involves the flexible substrate 402 is more affordable and faster to manufacture in comparison to structures that rely on the ceramic substrates 102, 202, 302, 312.

Attachment and electric connections via the strips that extend from the center portion of the flexible substrate 402 provide improved reliability and additional mechanical strength in comparison to known structures.

When used in a detector head employed for X-ray fluorescence spectrometry, due to material used for its construction the flexible substrate 402, if properly designed, provides reduced undesired X-ray fluorescence from the substrate in comparison to usage of the ceramic substrates 102, 202, 302, 312.

The strips that extend from the center portion of the flexible substrate 402 provide a convenient and flexible way of connecting the detector head to the header using simple techniques such as soldering while still providing a large detector chip 401 area.

The strips that extend from the center portion of the flexible substrate 402 provide a convenient means for testing a sub-assembly formed by the detector chip 401 and the flexible substrate 402 before attaching the thermoelectric cooler 403 thereto and/or before assembling the detector head on the header.

In an example, the flexible substrate 402 is provided as a flexible printed circuit board (PCB) that consists of a polymer layer with a flexible layer of metal on at least one side. The metal layer on at least one side of the flexible PCB 402 is patterned to form the conductive tracks that enable desired electric connections between the detector chip 401 attached on the first side of the flexible PCB 402 and the header. As an example, the polymer layer of the flexible PCB 402 may consist of polyimide and its thickness may be in a range from 8 to 100 micrometers (µm). It should be noted, however, that the polyimide as a material and the range of thicknesses provided herein serve as non-limiting examples only and other suitable materials and/or a thickness outside the exemplifying range may be employed instead. As an example, the metal layer on the flexible PCB 402 may be made of or it may comprise copper (Cu) and have a thickness in a range from 9 to 70 µm. However, Cu as a material and the range of thicknesses provided herein serve as non-limiting examples only and other suitable conductive metal and/or a thickness outside the exemplifying range may be employed instead.

Figure 6:
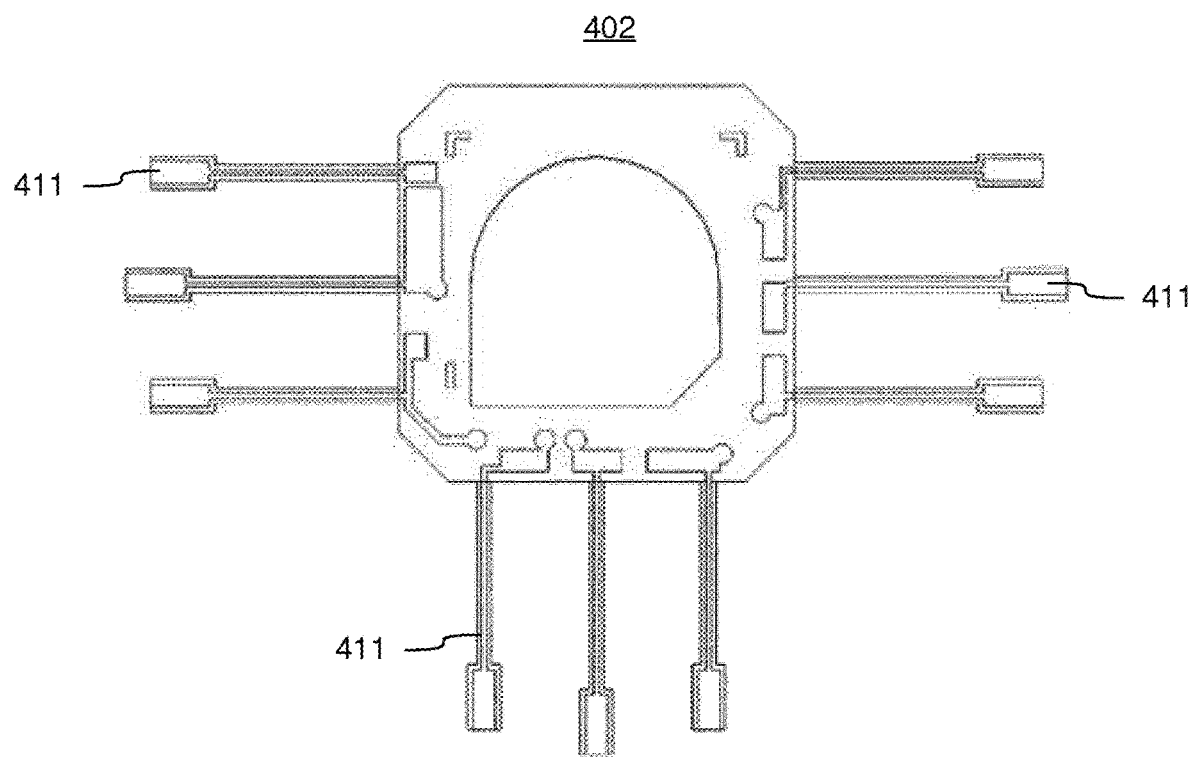
FIG. 6 schematically illustrates a flexible substrate according to an example embodiment.
Figure 7:
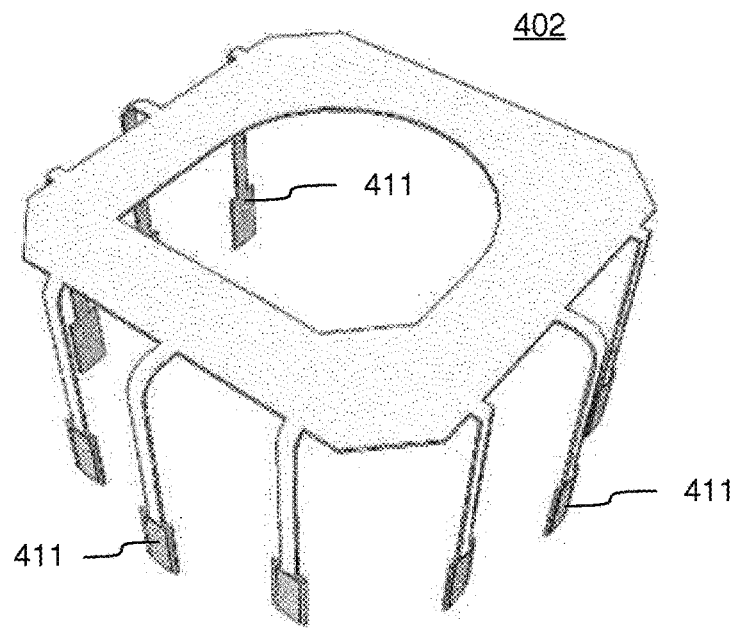
FIG. 7 schematically illustrates a flexible substrate according to an example embodiment.
Figure 8:
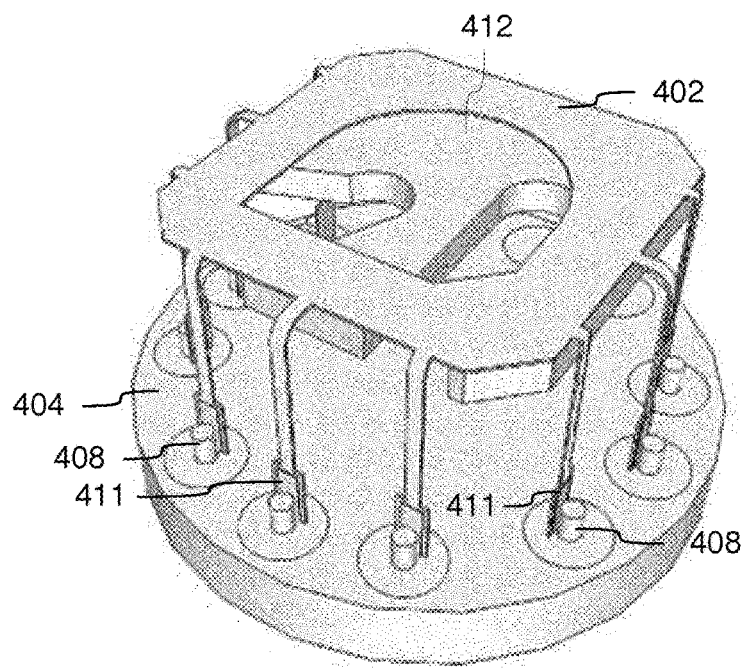
FIG. 8 schematically illustrates a flexible substrate assembled on a header according to an example embodiment.

FIGS. 6 to 8 illustrate the structure of the flexible substrate 402 according to a non-limiting example. In this regard, FIG. 6 depicts the second surface of the flexible substrate 402, i.e. the back surface of the flexible substrate 402, before bending the strips to protrude away from the first side. Therein, respective three strips extend to left, down and right from a center portion of the flexible substrate 402. Each of the strips has a respective conductive track 411 that extends from the proximal end to the distal end on its second surface and is further electrically connected by a conductive via through the strip to a conductive track arranged on the first surface at or close to the distal end of the strip (not shown in FIG. 6) to enable the electric connection between the flexible substrate 402 and one of the contact pins 408 of the header.

FIG. 6 further illustrates an opening within the center portion of the flexible substrate 402 and also shows that each of the conductive tracks 411 on the respective strip further extends to cover an area on the second side of the center portion of the flexible substrate 402, thereby enabling electric contact(s) between the back side of the detector chip 401 and the second side (back side) of the flexible substrate 402 e.g. by wire-bonding through the opening.

FIG. 7 depicts the flexible substrate 402 after the strips that extend from its center portion have been bent to protrude away from the first side. As can be seen from the illustration of FIG. 6, the center portion of the flexible substrate 402 now serves as the first side of the flexible substrate 402, which in the assembled form of the detector head serves as the front side to which the back side of the detector chip 401 is attached. Each of the conductive tracks 411 now extends away from the first side (front side) of the flexible substrate and hence away from the detector chip 401 to be attached on the first side of the flexible substrate 402 on the surface of the respective strip while continuing to provide the electric connection to the portion thereof that resides in the center portion that remains on the first side of the flexible substrate 402.

FIG. 8 depicts the flexible substrate 402 of FIG. 7 coupled to the header. In particular, the conductive tracks 411 on the strips that protrude from the flexible substrate 402 towards the header are coupled to the sides of respective contact pins 408 that protrude through the base plate 404 towards the detector head. FIG. 8 further depicts the first spacer 412 attached on the second side of the flexible substrate 402, part of which is visible through the opening in the center portion of the flexible substrate 402.

In another variation of the detector head structure described in the foregoing, the flexible substrate 402 may be replaced with a partially flexible substrate e.g. such that the center portion of the substrate or part thereof is essentially rigid while at least the part of the substrate that forms the strips is provided as flexible substrate to enable bending the strips to protrude away from the first surface of the substrate. An example of such partially flexible substrate is so-called rigid-flex PCB, where the rigid portion of the substrate may be made comprise or consist of glass fibre epoxy laminate or a corresponding rigid material and it may have thickness around or below 1 millimeter (mm).

Figure 9:
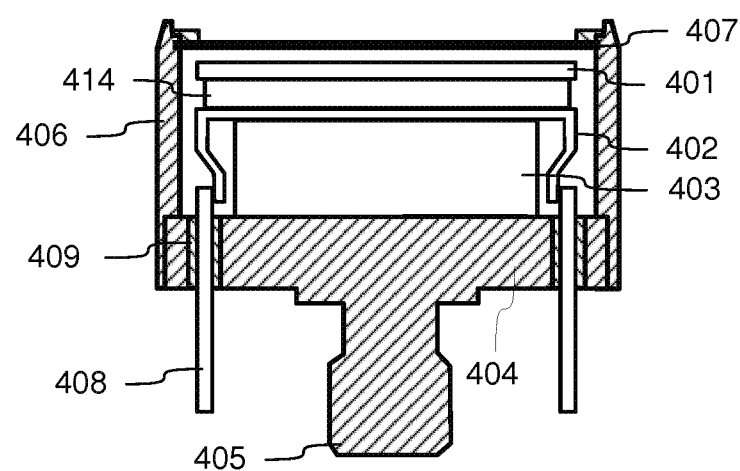
FIG. 9 schematically illustrates some components of a radiation detector assembly according to an example embodiment.

In a further variation of the detector head structure described in the foregoing, a second spacer 414 may be provided between the detector chip 401 and the flexible substrate 402 (or the partially flexible substrate), as illustrated by an example in FIG. 9. Inclusion of the second spacer 414 may be beneficial in some deployments to increase the distance between the flexible substrate 402 and the detector chip 401 in order to eliminate or reduce noise caused by cross-talk between the conductive tracks on the flexible substrate 402 and the detector chip 401. Moreover, when the detector head is employed for X-ray fluorescence spectrometry, the spacer may also serve to eliminate or attenuate undesired X-ray fluorescence caused by the conductive (metal) tracks in the flexible substrate 402 that may interfere with the radiation spectrum being measured using the detector head.

The spacer may be provided, for example, as a single-layer ceramic element or as a single layer of pure metal. In other examples, the spacer may be provided as a multi-layer ceramic element, as an element of multiple metal layers, or as an element that includes one or more ceramic layers together with one or more metal layers. Non-limiting examples of a suitable ceramic material comprise $Al_2O_3$, AlN and BeO, whereas non-limiting examples of a suitable metal include gold (Au), platinum (Pt), tungsten (W), palladium (Pd), zirconium (Zr), molybdenum (Mo), copper (Cu), chromium (Cr), titanium (Ti), aluminum (Al) and beryllium (Be). As an example, a highly conductive second spacer 414 electrically connected to a ground potential may be employed. The choice of the second spacer 414 structure and material may depend, for example, on the desired fluorescence lines (e.g. wavelengths) to be eliminated from or attenuated in the spectrum.

Figure 10:
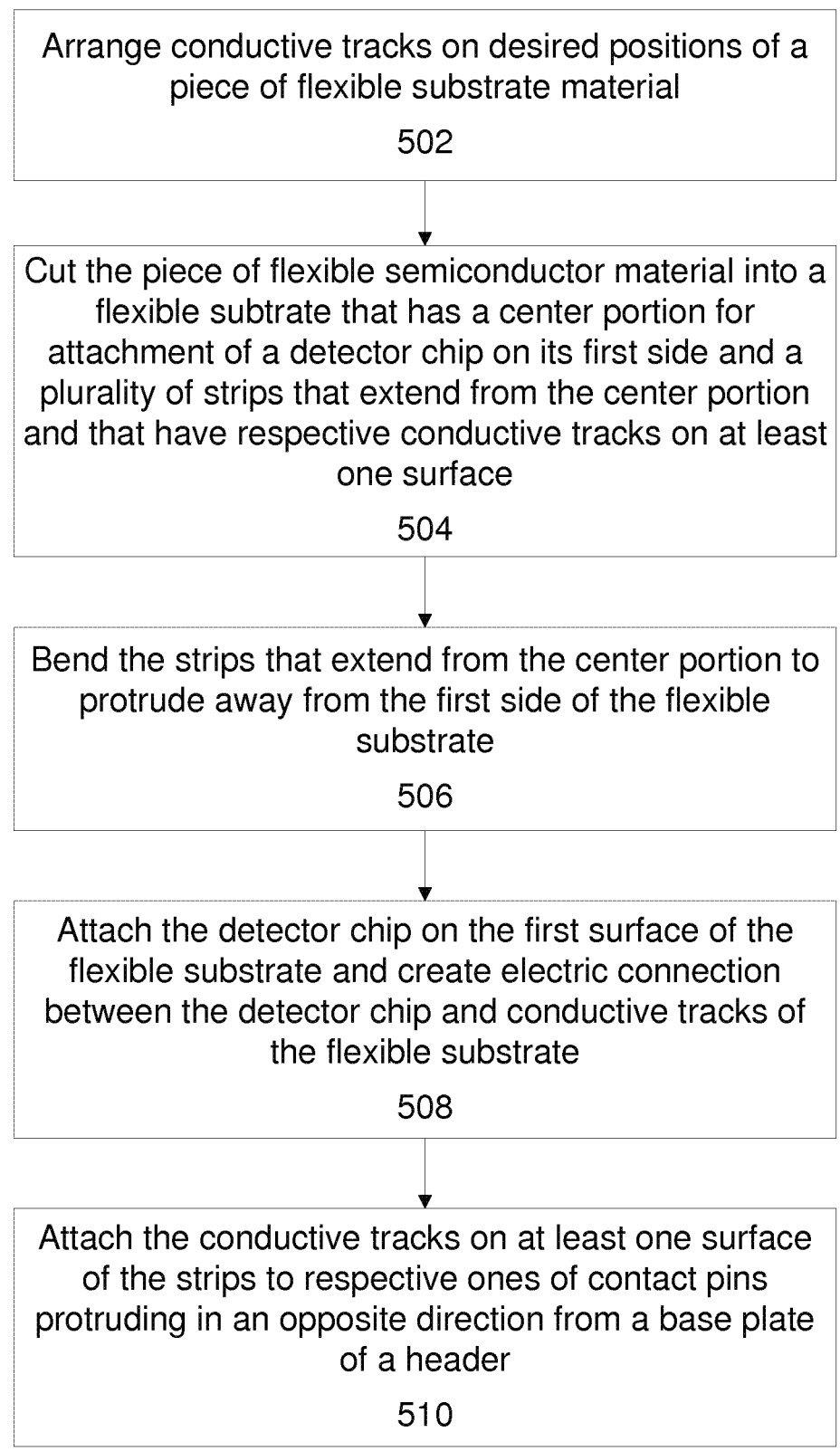
FIG. 10 illustrates a method according to an example embodiment.

In the following, with references to a flowchart depicted in FIG. 10, a method for manufacturing a detector head described in the foregoing is described. In this regard, the following steps may be included:

Arrange conductive tracks on desired positions of at least one surface of a piece of flexible substrate material, as indicated in block 502. This may involve metallizing at least one surface of the flexible substrate material on those positions where the conductive tracks are to be provided in the completed flexible substrate 402. Examples of such positions are described in the foregoing via a number of examples.

Cut the piece of a flexible substrate material into the flexible substrate 402 having a shape that includes the center portion for attachment of the detector chip 401 on the first side and a plurality of strips that extend from the center portion and that have respective conductive tracks on at least one surface, as indicated in block 504. An example of a suitable shape is depicted in FIG. 6.

Bend the strips that extend from the center portion of the flexible substrate 402 to protrude away from the first side of the flexible substrate 402, as indicated in block 506.

Attach the detector chip 401 to (the center portion of) the first surface of the flexible surface 402 and create electric connection(s) between the detector chip 401 and (at least one of) the conductive tracks of the flexible substrate 402, as indicated in block 508. As described in the foregoing, the electric connections between the detector chip 401 and the flexible substrate 402 may be provided using one of a plurality of ways, e.g. by providing wire-bonded connections between the second side (back side) of the detector chip 401 and the second side (back side) of (the center portion of) the flexible substrate 402.

Attach the conductive tracks in the strips protruding away from the first surface of the flexible substrate 402 to respective ones of the contact pins 408 that protrude in the opposite direction from the base plate 404 of the header to provide mechanical attachment and electric coupling therebetween, as indicated in block 510. As described in the foregoing, the conductive track on the surface of the strip may be arranged into contact with the side surface of the respective contact pin 408 and/or the connection between the conductive track and the contact pin 408 may be provided e.g. by soldering, by welding, by electrically conductive glue or by wire-bonding.

The method outlined in the foregoing may be varied or complemented in a number of ways without departing from the scope of the present invention. As non-limiting example in this regard, in block 508, the detector chip 401 may be attached to the flexible substrate via the second spacer 414 that is arranged between the detector chip 401 and the flexible substrate 402 e.g. as described in context of the example of FIG. 9. As another non-limiting example, between blocks 508 and 510, the thermoelectric cooler 403 may be attached to a sub-assembly of the detector chip 401 and the flexible substrate 402 (attached to each other directly or via the second spacer 414) before attaching the conductive tracks in the protruding strips to the contact pins 408. As a variation of this example, between blocks 508 and 510, the at least one component 413 is attached and electrically coupled to the flexible substrate 402 on its back side, followed by attachment of the thermoelectric cooler 403 to the back side of (the center portion of) the flexible substrate 402 via the first spacer 412.

Features described in the preceding description may be used in combinations other than the combinations explicitly described. Although functions have been described with reference to certain features, those functions may be performable by other features whether described or not. Although features have been described with reference to certain embodiments, those features may also be present in other embodiments whether described or not.

The invention claimed is:

1. A semiconductor radiation detector assembly comprising:
a header comprising a base plate having a plurality of contact pins protruding therefrom; and
a detector head disposed on the header, the detector head comprising
a detector chip having a front side configured to receive radiation and a back side, the detector chip comprising a silicon drift detector, and
a flexible substrate comprising
a center portion having its front side attached to the back side of the detector chip,
at least three strips extending from the center portion and bent to protrude away from the detector chip, and
a plurality of conductive tracks that respectively extend on a surface of said respective at least three strips from said center portion towards distal ends of said at least three strips that are attached to respective ones of the contact pins to electrically couple the detector head and the header and to mechanically attach the detector head and the header, the detector chip being electrically coupled to at least one of said conductive tracks,
wherein the plurality of contact pins protrude from the base plate towards said detector chip.

2. The semiconductor radiation detector assembly according to claim 1, wherein electric coupling between one of the conductive tracks and one of the contact pins comprises one of the following:
a soldered connection,
a welded connection,
a wire-bonded connection, and
a connection by electrically conductive glue.

3. The semiconductor radiation detector assembly according to claim 1, wherein said plurality of conductive tracks comprise
first conductive tracks that extend on a back surface of the flexible substrate from said center portion towards the distal ends of the strips,
second conductive tracks provided on a front surface of the flexible substrate at or close to the distal ends of the strips for electrical coupling to said plurality of contact pins, and
in each strip, a conductive via through the flexible substrate for electrical connection between respective one of the first and second conductive tracks.

4. The semiconductor radiation detector assembly according to claim 1, wherein the electrical coupling between the detector chip and at least one of the conductive tracks is provided through an opening in the center portion of the flexible substrate.

5. The semiconductor radiation detector assembly according to claim 1, wherein the flexible substrate comprises a flexible printed circuit board comprising a flexible metal layer disposed on a polymer layer, said flexible metal layer being patterned to form said conductive tracks.

6. The semiconductor radiation detector assembly according to claim 1, wherein the flexible substrate is attached to the detector chip via a spacer to increase the distance therebetween.

7. The semiconductor radiation detector assembly according to claim 6, wherein the spacer comprises at least one layer comprising zero or more metal layers and zero or more ceramic layers.

8. The semiconductor radiation detector assembly according to claim 1, wherein the flexible substrate is provided with a rigid portion that constitutes at least part of the center portion.

9. A method for providing a semiconductor radiation detector assembly, the method comprising:
providing a header comprising a base plate having a plurality of contact pins protruding therefrom, and a detector head disposed on the header;
arranging conductive tracks on desired positions of at least one surface of a piece of flexible substrate material;
cutting the piece of flexible substrate material into a flexible substrate having a shape that includes
a center portion to attach to a detector chip of the detector head on a first side, and at least three strips that extend from the center portion and that have respective one of the conductive tracks on at least one surface extending from the center portion towards distal ends of the at least three strips that are attached to respective ones of the contact pins to electrically couple the detector head and the header and to mechanically attach the detector head and the header;

attaching the conductive tracks in the distal ends of the at least three strips to respective ones of a plurality of contact pins to electrically couple the detector head and the header and to mechanically attach the detector head and the header;

bending said at least three strips to protrude away from the first side of the flexible substrate; and attaching the detector chip to the first side of the center portion of the flexible substrate and creating electric connection between the detector chip and at least one of the conductive tracks, the detector chip comprising a silicon drift detector.

* * * * *